United States Patent [19]

Di Forte et al.

[11] 4,309,667
[45] Jan. 5, 1982

[54] MULTIPLE LASER HAVING A DISTRIBUTED RESONATOR

[75] Inventors: Marie A. Di Forte; Michel Papuchon; Claude Puech, all of Paris, France

[73] Assignee: Thomson-CSF, Paris, France

[21] Appl. No.: 11,926

[22] Filed: Feb. 13, 1979

[30] Foreign Application Priority Data

Feb. 17, 1978 [FR] France .................................. 78 04529

[51] Int. Cl.³ .................................................. H01S 3/19
[52] U.S. Cl. ............................ 331/94.5 H; 350/96.11
[58] Field of Search ................. 331/94.5 H; 350/96.11

[56] References Cited

PUBLICATIONS

Aiki et al., "Frequency Multiplexing Light Source With Monolithically Integrated Distributed-Feedback Diode Lasers", *Applied Physics Letters*, vol. 29, No. 8, Oct. 15, 1976, pp. 506–508.

*Primary Examiner*—James W. Davie
*Attorney, Agent, or Firm*—Cushman, Darby & Cushman

[57] ABSTRACT

A semiconductor laser particularly useful for frequency multiplexing in optical telecommunications having a distributed resonator supplying from a single etched grating, two or more radiations of different wavelengths. The laser comprises a junction formed by an n-type substrate, a p-type radiation-confinement region, and a surface region, a grating being etched at the interface between the confinement region and the surface region. Useful elementary bands of the junction for the attainment of the laser effect are fixed by proton implantation in the surface region of the junction. The elementary band-type regions are convergent and form, with the perpendicular to the grooves of the grating, angles that are determined so that the spacing along the various bands has a specified value linked directly to the wavelength of the corresponding emitted radiation.

9 Claims, 4 Drawing Figures

MULTIPLE LASER HAVING A DISTRIBUTED RESONATOR

BACKGROUND OF THE INVENTION

1. Field of Invention

The invention relates to lasers and, more particularly, to lasers having a distributed structure. Such lasers have excellent amplification characteristics and a very large wavelength selectivity, the wavelength of the emitted radiation being directly linked to the grid spacing.

The invention is more particularly concerned with a laser device having a multiple distributed structure capable of emitting radiations of different wavelengths in the spontaneous emission band of the semiconductor, such radiations of different wavelengths being emitted sequentially or simultaneously, as desired.

2. Prior Art

A semiconductor laser structure capable of emitting a laser radiation having two or more wavelengths is well known in the art. This well known structure comprises, integrated on the same substrate, a plurality of lasers having distributed resonators. Each laser includes a distributed resonator having the proper spacing for emission in accordance with a specified wavelength. The paths of the stimulated emission are parallel, as are the grooves of the different gratings. At the ends the radiations to be combined are brought together and guided by an optical fiber, the wavelengths being combined with one another in sequence.

This type of structure leaves unetched intermediate regions on the substrate and requires the etching of a plurality of separate gratings having different spacings; the excitation means can be shared by the different lasers, but is necessary to provide guide areas in order to bring together the emitted radiations of different wavelengths.

SUMMARY OF THE INVENTION

The multiple-laser device having a distributed resonator in accordance with the present invention does not have the disadvantages resulting from separate gratings.

In particular, the laser embodying the principles of the invention emits laser radiations of different wavelengths from a single grating etched in the material. A guide means shared by the different elementary regions of the stimulated emission need only be provided to capture all the radiation.

BRIEF DESCRIPTION OF THE DRAWINGS

Other features and advantages of the invention will be better understood by reference to the following detailed description, offered by way of non-limitative example, with reference to the attached drawings wherein.

DESCRIPTION OF THE PREFERRED EMBODIMENT

Figure 1:
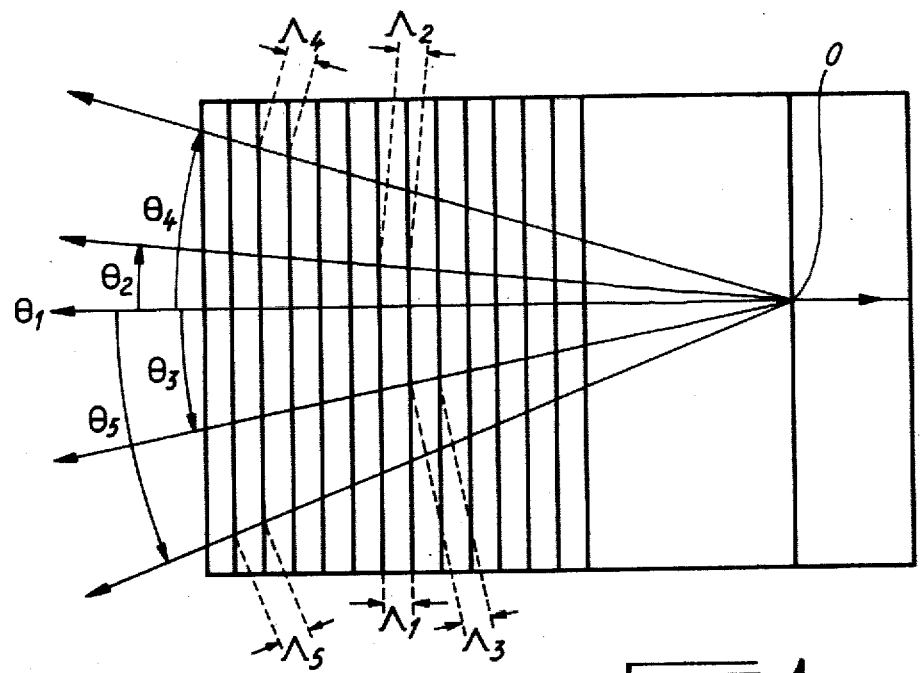
FIG. 1 is a schematic diagram of a laser embodying the principles of the invention.

In referring to the figures, like reference numerals represent like or corresponding parts throughout.

Lasers having distributed resonators comprise, instead of the end cavity mirrors employed in conventional lasers, a periodic structure in which the refractive index and the gain in the laser waveguide are spatially modulated. The grating permits a feedback between a guided mode propagating in one direction with a guided mode propagating in the opposite direction and in these particular conditions of excitation, grid spacing, doping, and dimensions of the different layers there is produced in the guide a laser effect with a wavelength defined by the following equation:

$$\Lambda = (k\lambda)/(2n_2) \tag{1}$$

where k is the order of the feedback employed, $\Lambda$ the grid spacing, $n_2$ the effective index of the active layer and $\lambda$ the wavelength of the emitted radiation. The multiple laser device having a distributed resonator in accordance with the present invention will be described with reference to a GaAs semiconductor laser, because the manufacturing technology of this type of laser is well known. In the example described, a third order of feedback (k=3) is assumed.

In the prior art, a GaAs laser comprises an n-doped GaAs substrate having a refractive index $n_1$, an active p-doped GaAs layer having a refractive index $n_2$, and an epitaxial $Ga_{1-a}Al_xAs$ layer having a refractive index $n_3$. Since the refractive index of the active layer is greater than the indices of the two other layers of the junction, the light emitted after the injection of minority carriers across the p-n junction can be guided in the active layer. The synchronism effect of the emission stimulated by reflection is obtained by means of a grating etched at the interface between the two p-doped layers.

In prior art lasers, the gratings are formed at the surface of an active p-doped GaAs layer through photolithography and an upper GaAlAs layer is subsequently formed on the layer in which the grating has been etched by the epitaxial process in the liquid or vapor phase or by molecular beam.

The present invention employs a manufacturing method that utilizes similar techniques to make a "multiple" laser, that is to say, one which is capable of simultaneously or sequentially emitting radiations of different wavelengths.

FIG. 1 is a schematic diagram of the device according to the present invention. Such a device includes a board in which there has been etched at the interface between the active and upper layers a grating composed of parallel grooves separated by $\Lambda$. In conventional devices, the upper layer is entirely doped and the region of excitation is limited by the control electrode. By contrast, in the laser according to the present invention, as will be described in greater detail hereinafter, the upper layer is practically formed by two superimposed layers, a first doped layer and a second very lightly doped layer in which the useful bands of the junction are obtained by proton implantation. The control electrodes for the excitation of the lasers thus formed can then be separated or joined (in this case, a single electrode layer covers the entire board), depending on whether the laser is to function sequentially or simultaneously.

Continuing to refer to FIG. 1, the proton-implantation regions have been reduced to straight lines, but they are actually bands approximately from 5 to 20 μm wide.

The first straight line, corresponding to a first useful junction region, is normal to the grooves: $\theta_1 = 0$. For the first laser, the spacing of the periodic structure is the spacing $\Lambda_1 = \Lambda$ of the grating.

The other useful bands are oblique in relation to the first band, each making angles $\theta_2$, $\theta_3$, $\theta_4$ and $\theta_5$ with the normal to the grooves. The spacings of the equivalent periodic structures correspond to $\Lambda_2$, $\Lambda_3$, $\Lambda_4$ and $\Lambda_5$, respectively. The respective positions of the regions are such that they converge toward one point 0 situated near a board edge. The apparent spacing of the periodic structures in each of the bands is linked to the angle $\theta_i$ which the band makes with the normal to the grating expressed by the relation: $\Lambda_i = (\Lambda_1/\cos\theta_i)$ where i = (1, 2, 3, 4, 5). Now, the wavelength of the emitted radiation is proportional to the periodic grid spacing in the direction of the useful band of the junction.

The wavelength of the radiation emitted as a function of the angle of the corresponding excited region in relation $\lambda_i = (\lambda_1./\cos\theta_i)$.

Thus, a heterojunction laser structure employing the third order of countercoupling will be obtained with a distributed resonator formed by a grid having a typical spacing $\Lambda_1 = 3490$ A for an emitted radiation having a wavelength $\lambda_1 = 8375$ A.

In fact, for a laser functioning in accordance with the third order, the grid spacing is represented by equation (1) above, where k = 3. Moreover, the effective refractive index of the GaAs guide is substantially equal to 3, 6.

Taking into consideration the width (of the order 100 A) of the spontaneous emission band of GaAs, it is possible to integrate on the same substrate five lasers for the purpose of selectively emitting in the wavelength of the radiations, whose wavelengths are staggered 20 A apart, for example. The apparent spacings of the corresponding periodic structures $\Lambda_i$ are such that:

$$\Lambda_i = (3/n_2)\cdot(\lambda_1/2 \cos\theta_i)$$

The different emission wavelengths are thus linked directly to the angle between the corresponding excited region and the normal to the grating in the plane of the sample and the regions are implanted in the following manner (for a given doping):

$\theta_1 = 0$, $\lambda_1 = 8395$ A
$\theta_2 = 4°$, $\lambda_2 = 8394$ A
$\theta_3 = 6°$, $\lambda_3 = 8415$ A
$\theta_4 = 7°$, $\lambda_4 = 8435$ A
$\theta_5 = 7.5°$, $\lambda_5 = 8455$ A For clarity, the angles $\theta_i$ are exaggerated as shown in FIG. 1.

Figure 2:
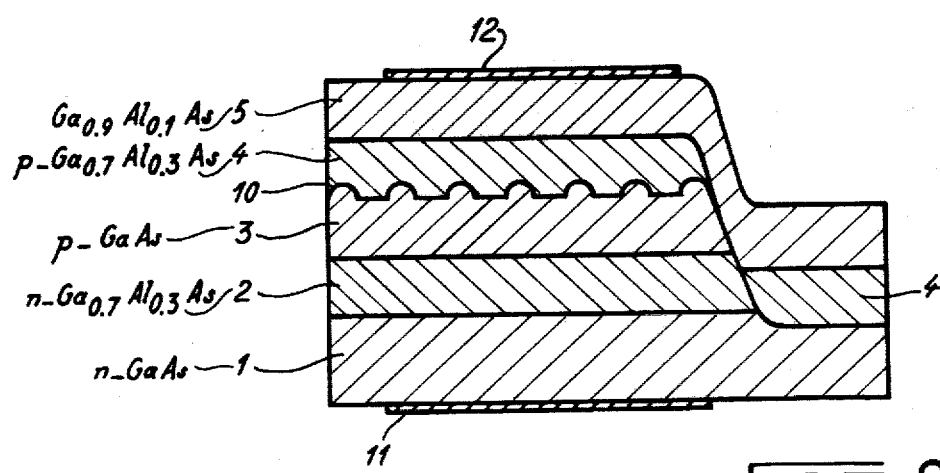
FIG. 2 is a cross-sectional view of a first embodiment of the laser according to the invention.

FIG. 2 is a cross-sectional view of a first embodiment of the device according to the present invention. In this figure, an n-doped GaAs substrate 1 is coated by epitaxial growth techniques in a liquid phase, for example, with an n-type first $Ga_{0.7}Al_{0.3}As$ layer 2 doped with Sn atoms on the order of a few micrometers thick (e.g., 3 μm), then with a p-type GaAs layer 3 doped with Ge atoms several tenths of a micrometer in thickness (e.g., 0.15 μm). Layer 3 is the active layer of the lasers. The etching of a grating 10 at the surface of active layer 3 is accomplished by ion bombardment or by chemical etching across a mask of photosensitive resin by means of holographic photolithography. The sample is then etched chemically up to substrate layer 1 in the direction of a band parallel to the grooves so as to form the base of the coupling region of the emitted radiation.

Then, a p-type $Ga_{0.7}Al_{0.3}As$ layer 4 doped with substituted germanium atoms is produced by the epitaxial growth techniques in a liquid phase, e.g., on the sample thus prepared, that is to say, on the active layer, on the surface of which the grating has been formed on the n-doped GaAs substrate 1, in the band where the other layers have been removed.

Finally, a last $Ga_{0.9}Al_{0.1}As$ layer 5, likewise obtained by epitaxial growth techniques in a liquid phase and very lightly doped with germanium atoms, is formed on layer 4. The useful bands of the junction are then determined with precision by proton implantation, e.g., in the direction of the bands 5 on the order of some 20 microns thick oriented in the direction $\theta_i$ towards the normal, as above described.

The next step of the fabrication process of the multiple laser according to the present invention is the making of the metal junctions 11 and 12 through which the electrical excitation of the laser occurs. These junctions can, for example, be obtained by depositing chromium and gold on the surface of the upper layer 5, and gold, platinum, and titanium on the surface of the substrate 1.

The length of the contact bands is of the order of several hundred micrometers. For a multiple laser in which all the elementary lasers are excited simultaneously, the metal junctions are formed by electrode 11 on the substrate 1 and by an electrode 12 on the upper face. For a multiple laser in which the elementary lasers can be excited independently of one another, the metal junctions are formed solely by bands taking the exact shape of the useful elementary bands on the other face. If the length of the elementary bands is adequate (more than 1 mm approximately), the lateral face of the sample opposite the emission surface of the radiation does not introduce a significant reflection in comparison with the reflections on the grating and there are no appreciable disturbances of the emission diagram. The wavelength selectivity of the radiation lines emitted by the multiple laser thus integrated is very large (the width of the emission lines is of the order of 0.5 A).

It should be noted that these emission lines shift as a function of the temperature and the doping function. In the guide area, a waveguide possibly branched out in the extension of the different useful bands of the junction is, for example, obtained by ionic or chemical etching. Each of the bands gives rise to the emission of a radiation of a particular wavelength and the different radiations are guided in the guide thus obtained and can, for example, permit frequency multiplexing of a plurality of signals in an optical fiber. It should be noted that the upper $Ga_{0.9}Al_{0.1}As$ layer 5 must be located in the guide area on the same level as the waveguide in which the radiation is confined. The device described with reference to FIG. 2 includes a double heterojunction.

Figure 3:
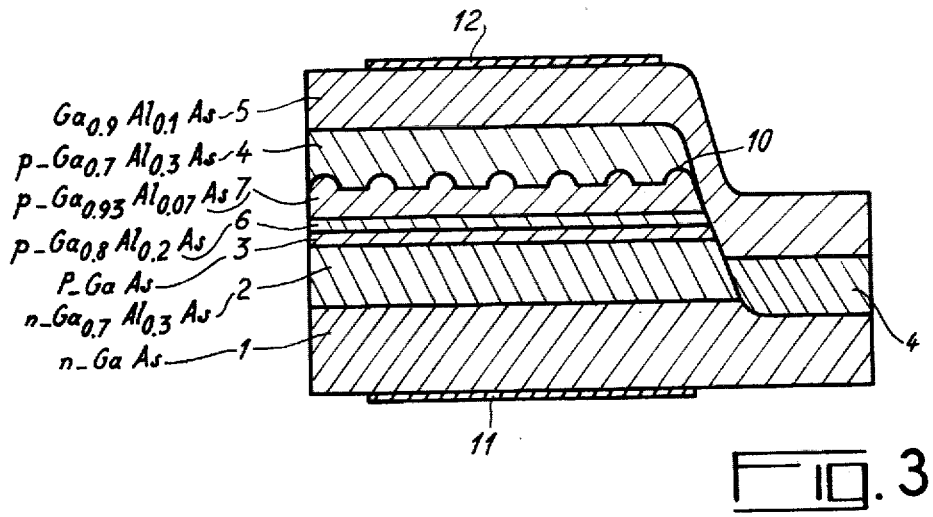
FIG. 3 is a cross-sectional view of a second embodiment of the laser according to the present invention having a structure including separate confinements.

Referring now of FIG. 3, which is a cross-sectional view of a second embodiment of the laser device according to the present invention, the performance of this type of laser device can be improved by use of a heterojunction structure having separate confinements, particularly in order to diminish the laser threshold current at ambient temperature. Like reference numberals denote like layers made up in the same manner as are the corresponding layers described with reference to FIG. 2. Thus, the multiple laser comprises an n-doped GaAs substrate 1 on which has been formed a layer 2 of $Ga_{0.7}Al_{0.3}As$ a ternary derivative of equally n-doped GaAs. Then, the active layer 3 of p-doped GaAs is deposited on layer 2.

Thereafter, two supplementary layers of ternary derivatives of GaAs are likewise obtained by epitaxial process in the liquid phase; first, a layer 6 of p-doped $Ga_{0.8}Al_{0.2}As$, then an equally p-doped layer 7 of $Ga_{0.93}Al_{0.07}As$, at the surface of which the grating is etched in the same way as above-described. The two layers have thicknesses of the order of several tenths of a micron.

The etching of the sample up to the substrate in order to form the guide area according to a band parallel to the grooves is then effected. Layers 4 and 5 of, respectively, p-doped $Ga_{0.7}Al_{0.3}As$ and very lightly doped $Ga_{0.9}Al_{0.1}As$ are then deposited.

The useful bands of the junctions are determined by proton implantation in the same manner as described above.

This type of double heterojunction structure with separate confinements enables confinement in the layers 7 ($Ga_{0.93}Al_{0.07}As$) of the photons traversing the barrier formed by the dielectric discontinuity between the layers 3 and 6.

Figure 4:
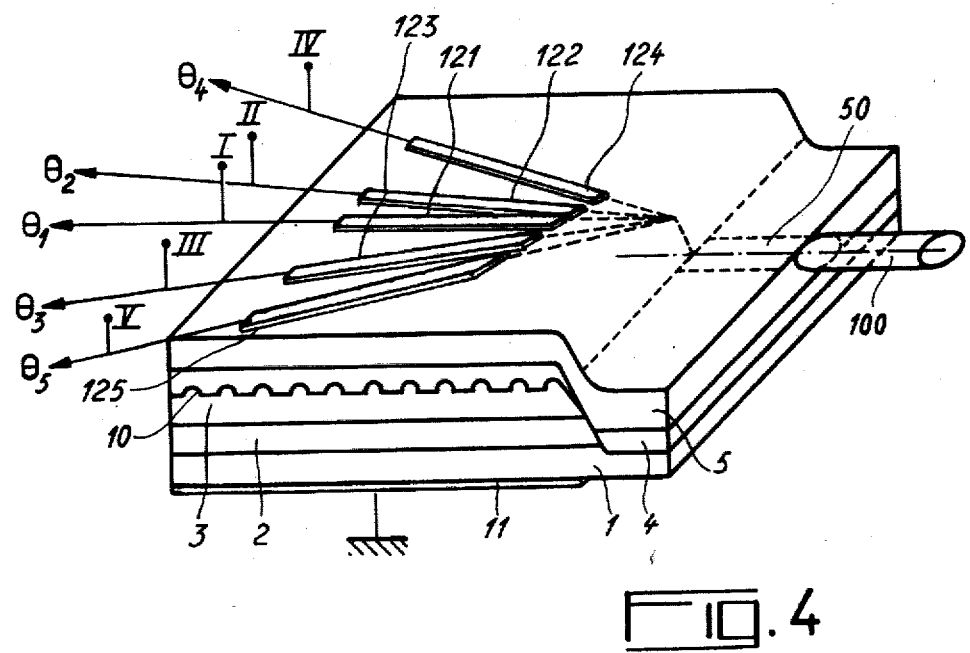
FIG. 4 is a perspective view of the laser shown in section in FIG. 2.

Referring now of FIG. 4 which is a perspective view of the multiple laser shown in section in FIG. 2, electrical control is accomplished between the electrode 11 coupled to ground and the electrodes 121, 122, 123, 124 and 125, being coupled one each to the terminals I, II, III, IV and V, respectively. The radiation is guided in a region 50 of the layer 5 and is captured by an optical fiber 100.

While particular embodiments of the invention have been shown by way of non-limitative examples, it will be understood that the invention is not limited thereto. In particular, it is possible to contemplate a simpler laser structure with a single heterojunction consisting simply of a substrate of n-doped GaAs, an active layer of p-doped GaAs, and a layer of ternary derivative of GaAs, $Ga_{1-x}Al_xAs$, where x is considerably less than 1 or even a structure having homojunction, that is to say, consisting of two GaAs layers, doped with n-type and p-type materials respectively. However, in these types of structures, the laser threshold conditions are more difficult to attain, particularly at ambient temperature.

Furthermore, the invention has been described as functioning in accordance with the third order of countercoupling, the grid spacing equalling three times the half wavelength of the corresponding radiation (except for the factor $1/n_2$).

It is, of course, possible to make the laser function in accordance with another order of countercoupling. There will also be an emission in a direction normal to the plane of the layer, except if the first order (k=1) is employed, but the grid spacing will then be very weak: $(\lambda_1/3) = 1163$ Å, which makes it more difficult to realize. In this last case, no light is emitted in a direction other than that of the guide.

Furthermore, five elementary lasers emitting in accordance with wavelengths 20 Å apart have been described and illustrated. However, the invention is not limited to this particular arrangement. It is possible to compute the angles the bands must make with the perpendicular to the grating to obtain the desired wavelengths, on condition that the spacing between the bands is such as not to cause any interaction.

The device has been described with reference to a GaAs junction but it is possible to utilize an InP junction with layers of quaternary derivatives of InP, such as $In_{1-x}Ga_xAs_{1-y}P_y$.

What is claimed and desired to be secured by Letters Patent of the United States is:

1. A multiple laser having a distributed resonator comprising:
   a semiconductor junction formed between lower and upper layers of different conductivity type materials coated on a substrate;
   said upper layer being an active layer having at least one region wherein pairs of holes and electrons give rise to photon emission;
   an etched grating arranged on top of said active layer for selecting a radiated mode; and
   electrode means arranged for causing a current to electrically excite selected portions of said semiconductor junction;
   said selected portions being bands of said junction arranged in directions at specified angles with grooves of said grating said bands being convergent at the level of an exit pupil, each of said bands being electrically excited by said current bringing about a laser emission of a specified wavelength in the spontaneous emission band of the semiconductor constituting said active layer.

2. The multiple laser of claim 1, wherein said substrate is an n-doped substrate and said active layer is a p-doped active layer overlaid with at least one surface layer, said bands being delineated in said active layer by proton implantation of said surface layer.

3. The multiple laser of claim 1 wherein said grating is formed by parallel equidistant grooves.

4. The multiple laser of claim 1 wherein said exit pupil towards which the radiation converges is coupled with a common output waveguide.

5. The multiple laser according to claim 1, wherein said junction is a simple heterojunction, said surface layer being a ternary derivative of the semiconductor material constituting said substrate and said active layer.

6. The multiple laser according to claim 1, wherein said junction comprises a heterojunction structure having separate confinements and comprises between said active layer and, respectively, said substrate and said surface layer, two layers of a ternary derivative of said semiconductor material respectively doped with n-type and p-type impurities, said surface layer itself being another ternary derivative of the same material, said grating being etched at the surface of said active layer.

7. The multiple laser according to claim 1, wherein said junction comprises a heterojunction structure having separate confinements, said structure comprising in sequence:
   an n-doped substrate;
   a layer of a first ternary derivative of said n-doped substrate;
   an active layer;
   a lower and an upper supplementary layer of p-doped ternary derivatives of said substrate;
   a second equally p-doped layer of said first ternary derivative;
   a surface layer; and
   a grating being etched at the surface of said upper supplementary layer.

8. The multiple laser according to any one of claims 3–5 wherein the semiconductor employed is gallium arsenide (GaAs), the ternary derivatives thereof having the form $Ga_{1-x}Al_xAs$, where $x$ is in the range between 0.3 and 0.07, depending on the layers.

9. The multiple laser according to claim 4 wherein said common output waveguide is a product of ionic or chemical etching.

* * * * *